(12) United States Patent
Tabatabaie et al.

(10) Patent No.: US 7,834,456 B2
(45) Date of Patent: Nov. 16, 2010

(54) ELECTRICAL CONTACTS FOR CMOS DEVICES AND III-V DEVICES FORMED ON A SILICON SUBSTRATE

(75) Inventors: Kamal Tabatabaie, Sharon, MA (US); Michael S. Davis, Ipswich, MA (US); Jeffrey R. LaRoche, Lowell, MA (US); Valery S. Kaper, Winchester, MA (US); John P. Bettencourt, Danvers, MA (US)

(73) Assignee: Raytheon Company, Waltham, MA (US)

( * ) Notice: Subject to any disclaimer, the term of this patent is extended or adjusted under 35 U.S.C. 154(b) by 73 days.

(21) Appl. No.: 12/356,254

(22) Filed: Jan. 20, 2009

(65) Prior Publication Data

US 2010/0181674 A1    Jul. 22, 2010

(51) Int. Cl.
*H01L 23/48* (2006.01)
*H01L 23/52* (2006.01)
*H01L 29/40* (2006.01)

(52) U.S. Cl. ............................. 257/745; 257/E27.014; 257/E27.015; 438/604

(58) Field of Classification Search .................... None
See application file for complete search history.

(56) References Cited

U.S. PATENT DOCUMENTS

| | | | |
|---|---|---|---|
| 4,774,205 A | 9/1988 | Choi et al. | |
| 5,308,444 A | 5/1994 | Fitzgerald, Jr. et al. | |
| 6,171,936 B1 | 1/2001 | Fitzgerald | |
| 6,703,144 B2 | 3/2004 | Fitzgerald | |
| 6,713,326 B2 | 3/2004 | Cheng et al. | |
| 7,256,142 B2 | 8/2007 | Fitzgerald | |
| 7,301,180 B2 | 11/2007 | Lee et al. | |
| 7,332,417 B2 | 2/2008 | Westhoff et al. | |
| 7,390,701 B2 | 6/2008 | Cheng et al. | |
| 7,465,619 B2 | 12/2008 | Fitzgerald | |
| 2006/0284247 A1 | 12/2006 | Augustine et al. | |
| 2007/0105335 A1 | 5/2007 | Fitzgerald | |
| 2008/0070355 A1 | 3/2008 | Lochtefeld et al. | |
| 2008/0149915 A1 | 6/2008 | Mori et al. | |

OTHER PUBLICATIONS

Notification of Transmittal of the International Search Report and thej Written Opinion of the International Searching Authority, or the Declaration, PCT/US2010/021443 dated Apr. 14, 2010, 6 pages.
Written Opinion of the International Searching Authority, PCT/US2010/021443 dated Apr. 14, 2010, 7 pages.

(Continued)

*Primary Examiner*—Jarrett J Stark
(74) *Attorney, Agent, or Firm*—Daly, Crowley, Mofford & Durkee, LLP (57) ABSTRACT

A semiconductor structure having a substrate, a seed layer over the substrate; a silicon layer disposed on the seed layer; a transistor device in the silicon layer; a III-V device disposed on the seed layer; and a plurality of electrical contacts, each one of the electrical contacts having a layer of TiN or TaN and a layer of copper or aluminum on the layer of TaN or TiN, one of the electrical contacts being electrically connected to the transistor and another one of the electrical contacts being electrically connected to the III-V device.

20 Claims, 8 Drawing Sheets

OTHER PUBLICATIONS

"Chapter 12: Metallization" In: Quirk M, Serda J: "Semiconductor Manufacturing Technology", Jan. 1, 2001, Prentice-Hall, Inc., Upper Saddel River, NJ, US, XP002576021. ISBN: 0130815200, pp. 299-333.

Katherine Herrick, Thomas Kazior, Amy Liu, Dmitri I. Loubychev, Joel M. Fastenau, Miguel Urteaga, Eugene A. Fitzgerald, Mayank T. Bulsara, David Clark, Berinder Brar, Wonill Ha, Joshua Bergman, Nicolas Daval and Jeffery Laroche, Direct Growth of III-V Devices on Silicon, Matter Res. Soc. Symp. Proc., vol. 1068, 2008, pp. 1-6.

Carl H. Dohrman, Kamesh Chilukuri, David M. Isaacson, Minjoo L. Lee, Eugene A. Fitzgerald, Fabrication of Silicon On Lattice Engineered Substrate (SOLES) as a Platform For Monolithic Integration of CMOS and Optoelectronic Devices, Materials Science and Engineering B, 2006, pp. 235-237.

ELECTRICAL CONTACTS FOR CMOS DEVICES AND III-V DEVICES FORMED ON A SILICON SUBSTRATE

CROSS-REFERENCE TO RELATED APPLICATIONS

This application relates to co-pending patent application U.S. patent application Ser. No. 12/356,252 filed on the same day as this patent application, the entire subject matter thereof being incorporated herein by reference.

TECHNICAL FIELD

This invention relates generally to electrical contacts and more particularly to electrical contacts for CMOS devices and III-V devices formed on silicon substrates.

BACKGROUND AND SUMMARY

As is known in the art, Si CMOS VLSI integration capability is passing the one-billion transistors level. As is also known in the art, some applications require that analog, RF or electro-optical devices also be formed on the same substrate as the CMOS devices. These analog, RF or electro-optical devices are typically III-V devices. One technique described to integrate the CMOS devices and the III-V devices uses a seed layer of Ge, as described in U.S. Patent Application publication No. 2008/0149915 A1 published Jun. 26, 2008, see also U.S. Pat. Nos. 7,374,106; 7,286,726; 7,057,256; 6,930,82; 5,767,539, 6,154,475, 7,321,713, and 7,057,256. See also, "Fabrication of silicon on lattice-engineered substrate (SOLES) as a platform for monolithic integration of CMOS and optoelectronic devices", by Dohrman et al., published in Materials Science and Engineering B 135 (2006) 235-237. See also "Direct Growth of III-V Devices on Silicon", by Herrick et al., published in Material Research Society Symposium Proceedings, Volume 1068, Materials Research Society (1068-C02-10).

As is also known in the art, high temperature process techniques are used to form small geometry, Cu on TaN or TiN, electrical contacts to the CMOS devices, while on the other hand, III-V electrical contacts are typically TiPtAu or TiAu and are fabricated using lift off techniques.

The inventors have recognized that the use of the TiPtAu or TiAu lift off techniques limits the circuit density and is also incompatible with the well established Si CMOS VLSI copper based interconnect process. This invention solves the problem of interconnects between the heterogeneously integrated III-V devices with the Si CMOS VLSI copper based metal interconnect process at the very first level of metal interconnect step. This invention describes a metallization scheme for heterogeneous integration of III-V devices with Si CMOS which is fully compatible with CMOS VLSI metal interconnect process.

In accordance with the present invention, a semiconductor structure is provided having: a substrate; a seed layer over the substrate; a silicon layer disposed on the seed layer; a transistor device in the silicon layer; a III-V device disposed on the seed layer; and a plurality of electrical contacts, each one of the electrical contacts having a layer of TiN or TaN and a layer of metal on the layer of TaN or TiN, one of the electrical contacts being electrically connected to the Si CMOS transistor and another one of the electrical contacts being electrically connected to the III-V device.

In one embodiment, the metal is copper or aluminum.

With such an arrangement, the problem of interconnects between the heterogeneously integrated III-V devices with the Si CMOS VLSI copper or aluminum based metal interconnect process at the very first level of metal interconnect step is solved. The arrangement is fully compatible with CMOS VLSI metal interconnect process. The arrangement uses advanced thin film technology available today, such as Atomic Layer Deposition (ALD) method to provide a fully CMOS VLSI process compatible metal interconnects method by the use of ALD deposited TiN and/or TaN to contact the source, drain, and gate of III-V FET or emitter, base, and collector of III-V HBT to prevent the interdiffusion between these contacts and the copper (Cu) or aluminum (Al) based SI CMOS VLSI interconnects. Furthermore, the arrangement provides copper or aluminum based low resistance and inductance access to the terminals of III-V based devices in a heterogeneously integrated III-V device on a Si substrate. As mentioned previously, the arrangement is fully compatible with Si CMOS VLSI metal interconnects process.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
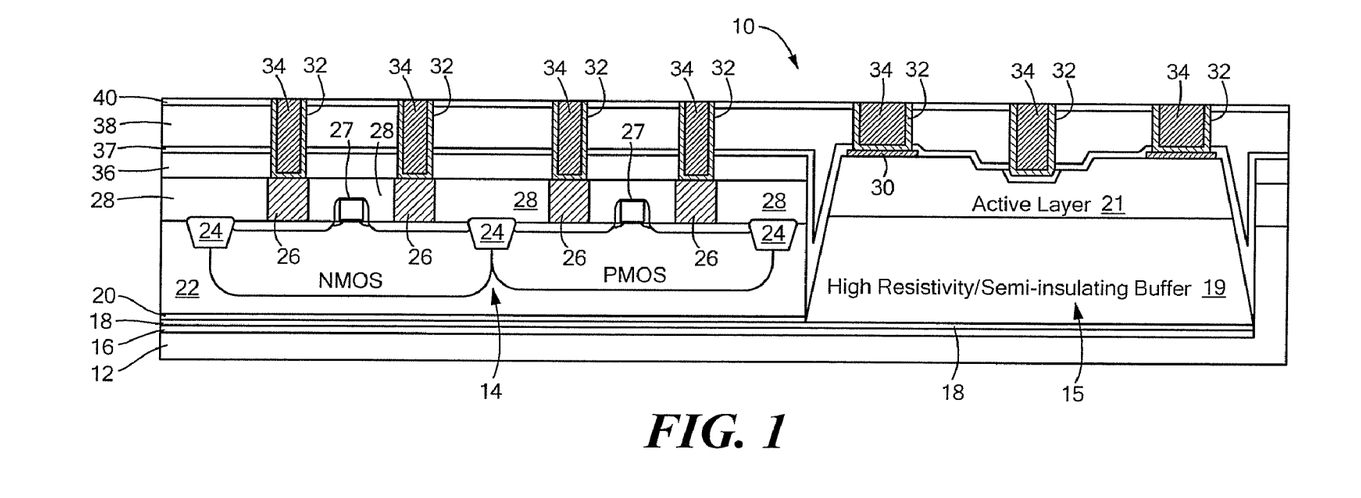
FIG. 1 is a cross sectional sketch of a semiconductor structure according to the invention, such structure having a substrate with CMOS FETs formed in a silicon layer on such substrate and having a III-V FET formed on the substrate.

Referring now to FIG. 1, a semiconductor structure 10 is shown having formed on a one portion of a silicon semiconductor 12 CMOS field effect transistors (FETs) 14 and formed on a laterally spaced portion of the silicon substrate a III-V FET 15. The silicon semiconductor 12 is here bulk silicon having a high or low resistivity depending on application.

Disposed on the silicon substrate 12 are a silicon dioxide insulating layer 16 and a 15 seed layer 18, such as Ge, on the silicon dioxide layer 16. A silicon dioxide insulating layer 20 is disposed on the portion of the silicon substrate 12 having thereon the CMOS transistors 14. There is a layer 22 of silicon on the silicon dioxide insulating layer 20, as shown. The CMOS transistors 14 are formed in the silicon layer 22, as shown. The NMOS transistor is electrically insulated from the PMOS transistor by dielectric, here silicon dioxide, regions 24, as shown.

The seed layer 18 has formed thereon a high resistivity/semi-insulating buffer layer 19 of here GaAs. A layer 21 of III-V material, such as GaAs, is formed on the buffer layer 19.

There are tungsten (W) contacts 26 to the source and drain regions of the CMOS transistors 14, as shown. The gate electrodes of the CMOS transistors 14 are indicated by the numerical designation 27. The tungsten contacts 26 are electrically isolated from each other by a layer 28 of silicon dioxide, as shown. There are Ge/W, Ni/Ge/W, Pd/Ge/Al or Pd/Ge/W contacts 30 to the source and drain regions of the III-V FET 15.

An Atomic Layer Deposited (ALD) layer 32 of TiN and/or TaN is deposited on the tungsten contacts 26 and on the Ge/W or Ni/Ge/W contacts 30. The layer 32 of TiN and/or TaN is in Schottky contact with the gate region of the III-V FET 15. There are electrical conductors 34, here electroplated copper, formed on the layer 32. It is noted that the layers 32 and 34 are electrically insulated by dielectric layers, 36, 37, 38, and 40. Here layers 36, 37, 38, and 40 are: silicon dioxide (layer 36); PECVD SiN (layer 37); a low K interlayer of SiOC (Silicon oxy carbide, i.e., a Silicon Dioxide layer which is doped with C and is used in production of Si CMOS VLSI), (layer 38); and a PECVD layer of SiN (layer 40), respectively. Here layer 32 is TiN or TaN.

More particularly, layer 36 on layer 28 and on tungsten (W) contacts 26, is silicon dioxide. Layer 37 is on layer 36, layer 37 is a thin PECVD layer of SiN. Layer 38 is on layer 37, layer 38 is low dielectric constant (low k ILD, here a Silicon oxy carbide, i.e., a Silicon Dioxide layer which is doped with C and is used in production of Si CMOS VLSI Layer 40 is on layer 38, layer 40 is a PECVD hard mask for the copper CMP.

Referring now to FIGS. 2A-2G the process of forming the structure 10 is shown. Thus, referring to FIG. 2A, after a structure having the silicon dioxide insulating layer 16 on the silicon substrate 12 with the seed layer 18 on the silicon dioxide layer 16, the silicon dioxide insulating layer 20 on the seed layer 18, the layer 22 of silicon on the silicon dioxide insulating layer 20, the CMOS transistors 14 formed in the silicon layer 22, the tungsten (W) contacts 26 formed to the source and drain regions of the CMOS transistors 14 and the dielectric layer 36, a III-V device island region 50 is etched through to the upper surface of the seed layer 18.

Figure 2A:
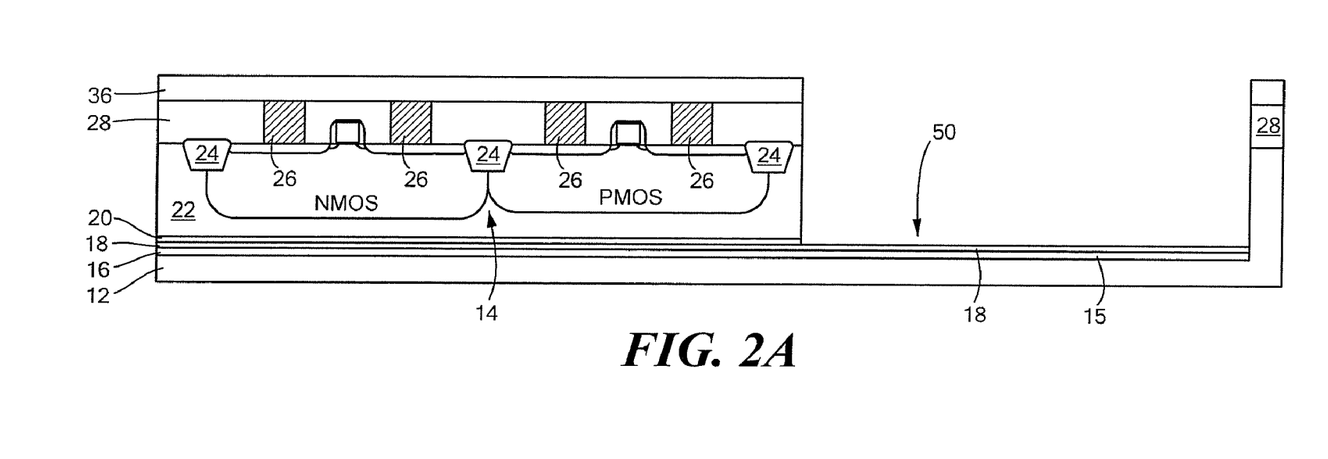
FIGS. 2A-2G are cross sectional sketches of the semiconductor structure of FIG. 1 at various stages in the fabrication thereof.
Figure 2B:
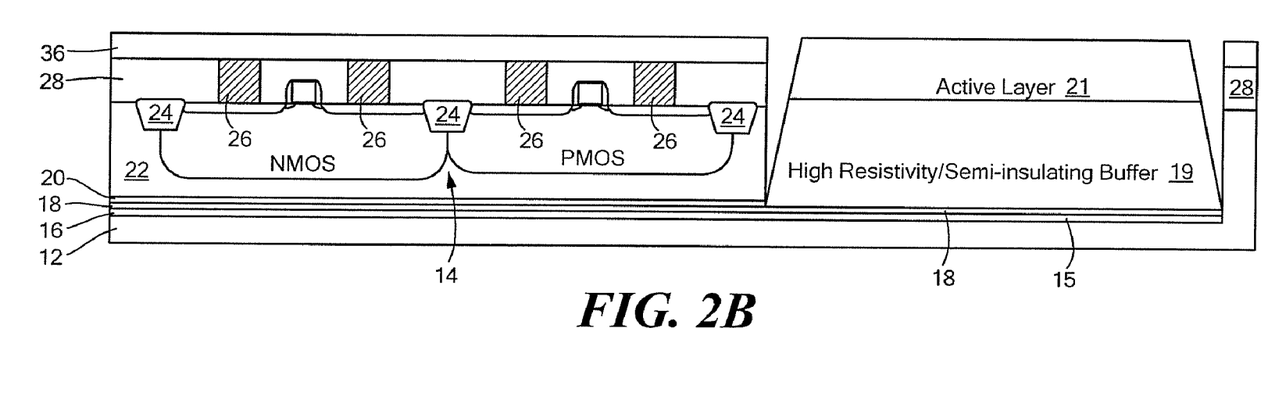

Referring now to FIG. 2B, the high resistivity/semi-insulating buffer layer 19 of a III-V material, here, for example, GaAs is formed on the upper surface of the seed layer 18. An active III-V layer 21, for example, InP or GaAs is formed on the buffer layer 19, using, for example, Molecular Beam Epitaxy (MBE) or Metal Organic CVD (MOCDV) growth techniques known to those skilled in the art of III-V material growth.

Figure 2C:
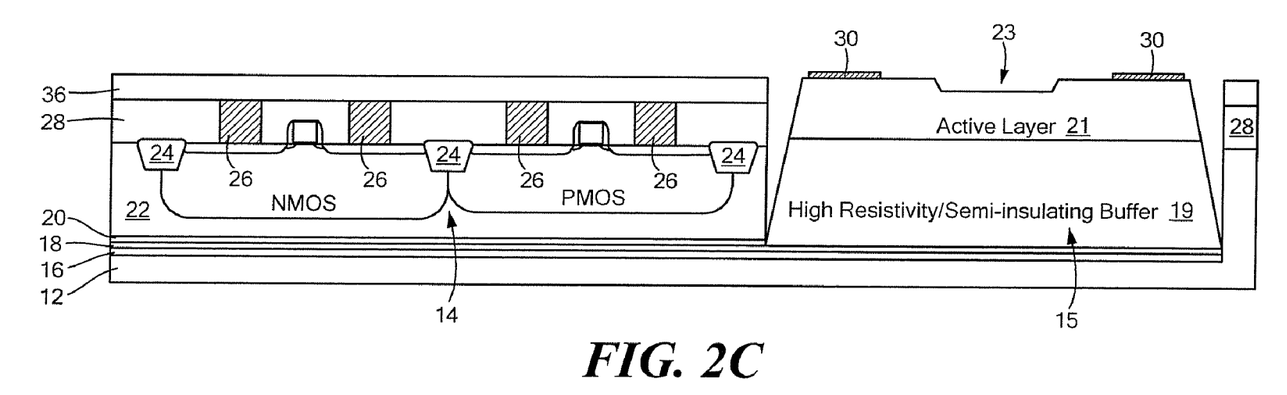

Referring now to FIG. 2C, the source and drain contacts 30, here Ge/W or Ni/Ge/W material are formed on the source and drain regions of the active layer 21 followed by alloying at temperatures of 410 to 450 C depending on the III-V device structure. Here a gate recess 23 is formed on the upper surface of the active layer 21, as shown.

Figure 2D:
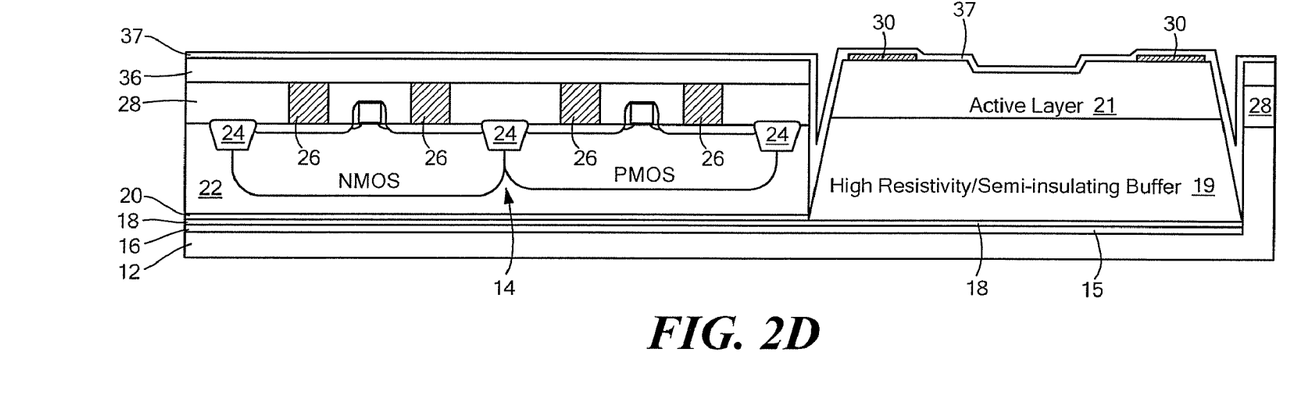

Referring now to FIG. 2D, the thin PECVD SiN layer 37 is formed over the upper surface of the structure shown in FIG. 2C, as shown.

Figure 2E:
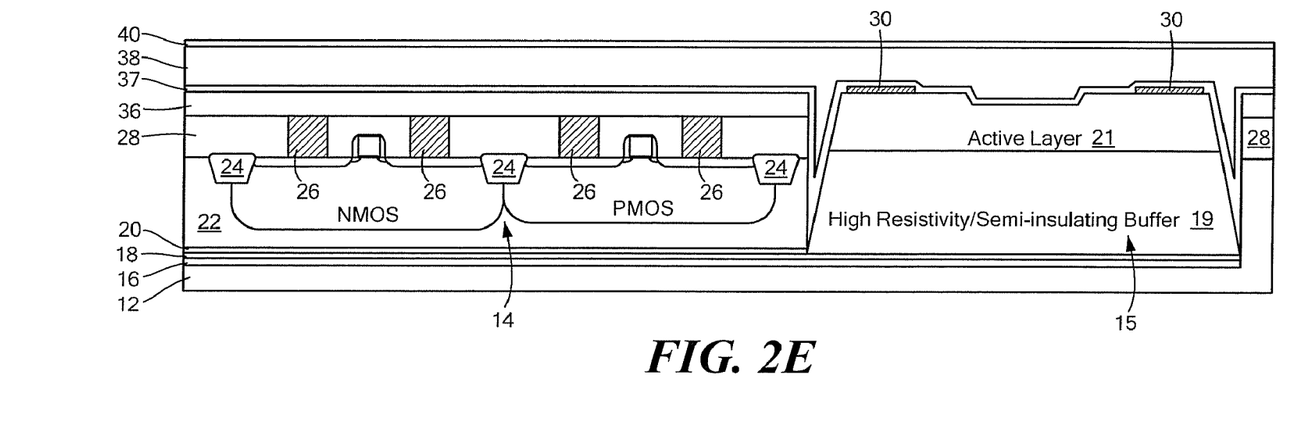

Referring now to FIG. 2E, the low dielectric (low K) interlayer 38 is formed on the thin PECVD SiN layer 37 followed by deposition of the PECVD SiN hard mask layer 40 for copper CMP is formed on the low dielectric (low K) interlayer 38.

Figures 2F, 2G:
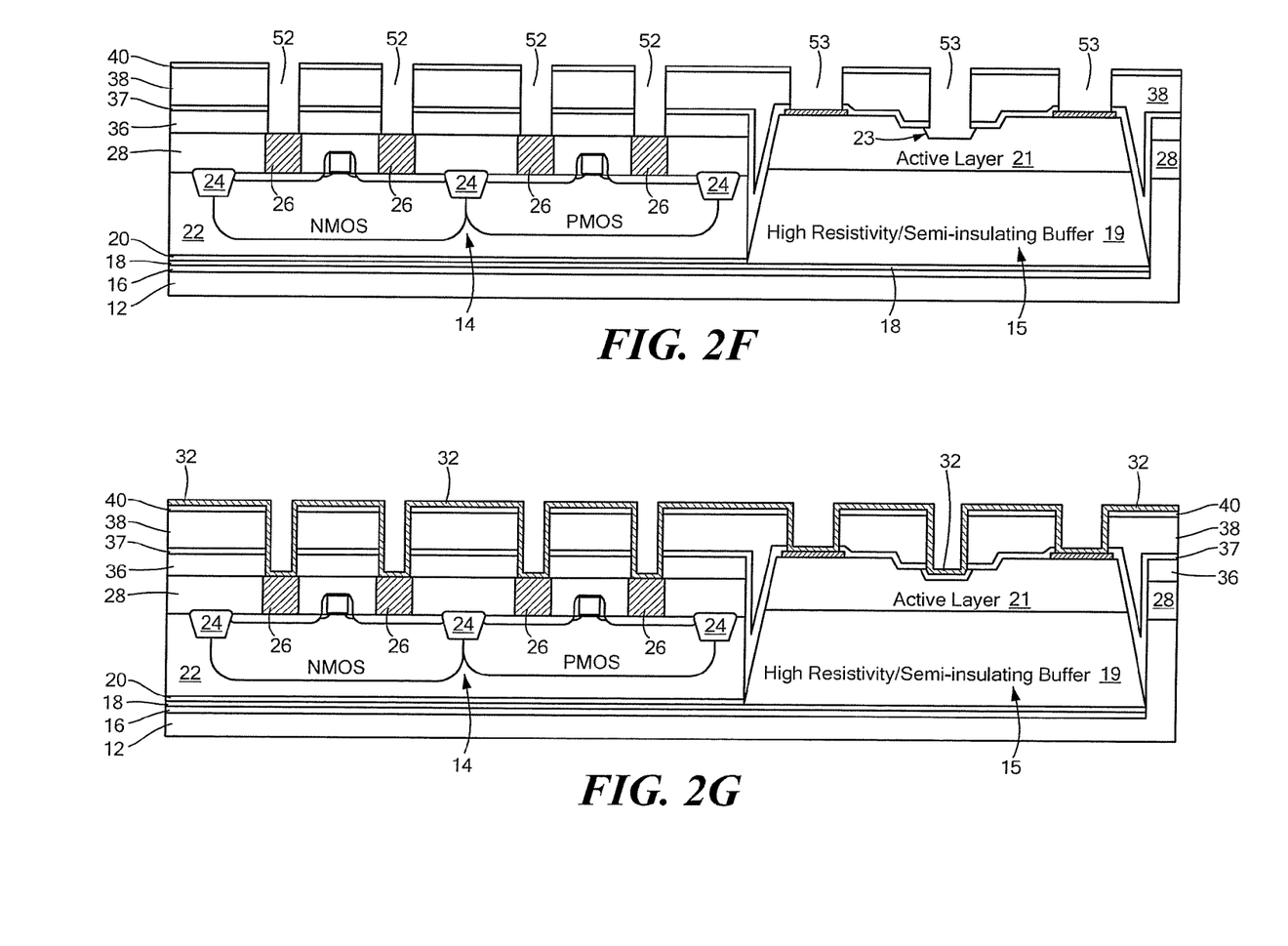

Referring now to FIG. 2F, contact holes 52 are formed through the dielectrics to reach the tungsten plugs 26 for the NMOS and PMOS FETs 14 and contact holes 53 are formed through the dielectrics to reach the source and drain contacts 30 for the III-V FET device 15 and the gate region 23 of the III-V FET device 15. Here, there is an additional non-critical wet etch on the active layer 21 portion for the gate 23 to form a double recess gate region.

Referring now to FIG. 2G, the atomic deposited layer 32 Ni/TiN or Ni/TaN, (it being noted that if the III-V device is GaAs or InP based, the atomic layer deposited film would be TiN or TaN whereas if the III-V device is GaN based, the atomic layer deposited film would be Ni/TiN or Ni/TaN) is deposited over the surface of the structure shown in FIG. 2F.

The copper layer 34 is electroplated on the surface of layer 32 and then is chemically mechanically polished (CMP) resulting in the structure shown in FIG. 1.

Referring now to FIGS. 3A-3H the process of forming a structure having CMOS transistors and a III-V heterojunction bipolar transistor (HBT) is shown. Here again the process begins with a structure having the silicon dioxide insulating layer 16 on the silicon substrate 12 with the seed layer 18 on the silicon dioxide layer 16, the silicon dioxide insulating layer 20 on the seed layer 18, the layer 22 of silicon on the silicon dioxide insulating layer 20, the CMOS transistors 14 formed in the silicon layer 22, the tungsten (W) contacts 26 formed to the source and drain regions of the CMOS transistors 14 and the dielectric layer 36, a III-V device island region 50 is etched through to the upper surface of the seed layer 18.

Figure 3A:
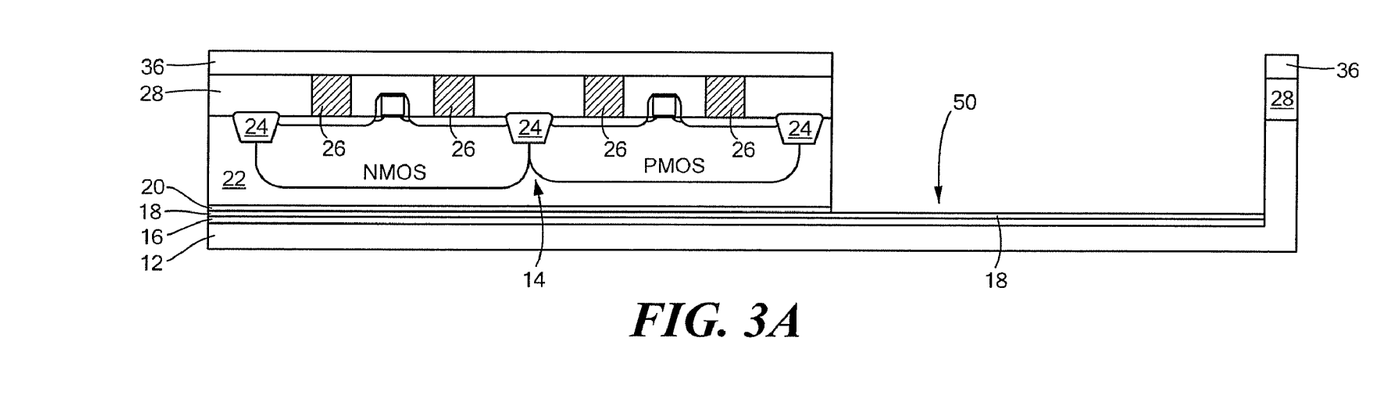
FIGS. 3A-3H are cross sectional sketches of another semiconductor structure according to another embodiment of the invention at various stages in the fabrication thereof, such structure having a substrate with CMOS FETs formed in a silicon layer on such substrate and having a III-V HBT formed on the substrate.
Figure 3B:
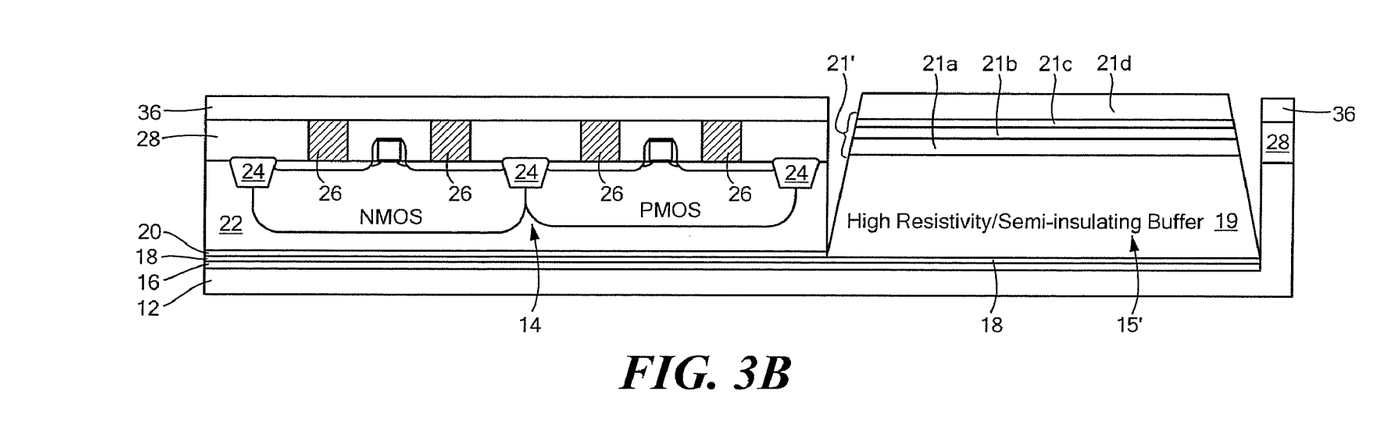

Referring now to FIG. 3B, the high resistivity/semi-insulating layer 19 is formed on the upper surface of the seed layer. An active III-V layer 21', for example, InP or GaAs is formed on the buffer layer 19. Here, a lower sub collector layer 21a with very heavy doping on top followed by a III-V collector layer 21b, followed by a III-V base layer 21c followed by a III-V emitter layer 21d, as shown.

Figure 3C:
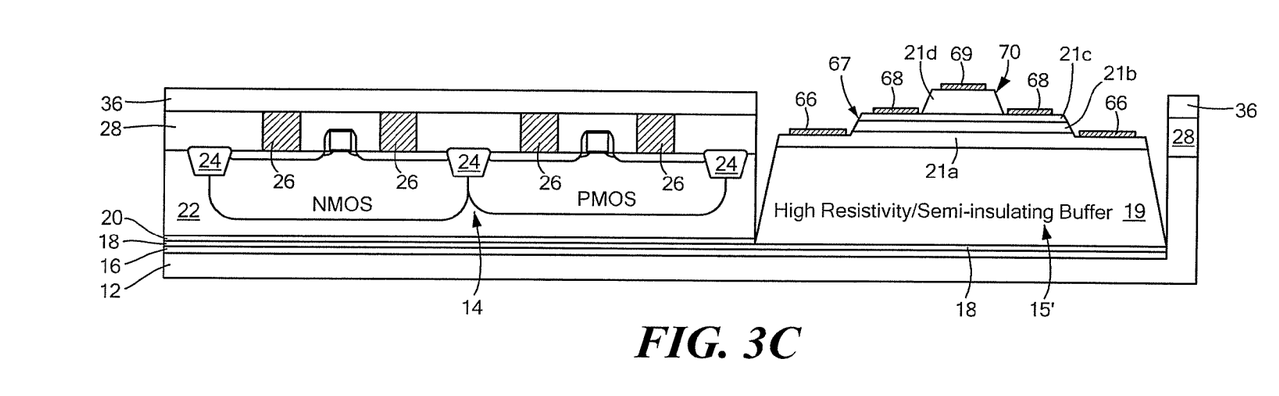
Figure 3D:
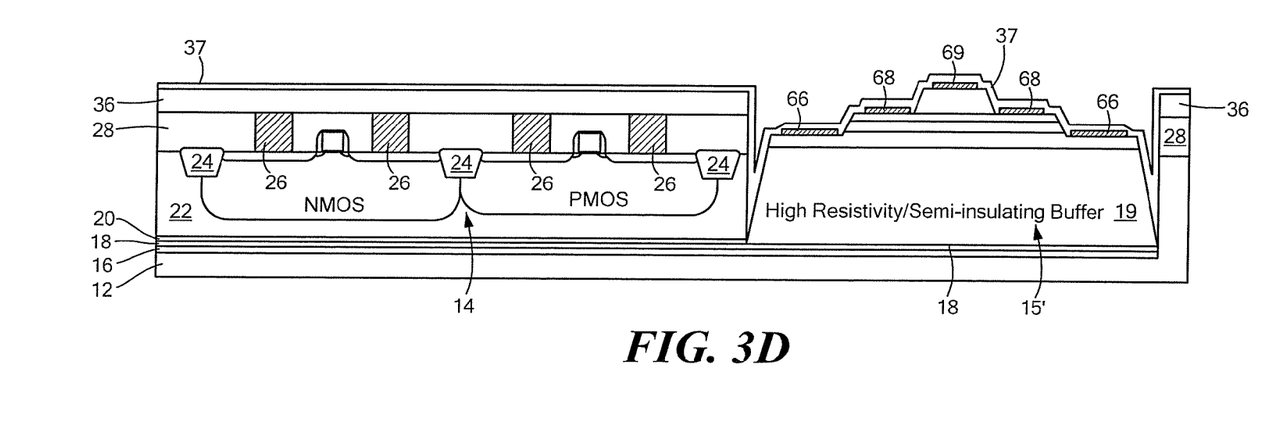

Referring to FIG. 3C, collector ohmic contacts 66 are formed along with base-collector mesa 67, base ohmic contact 68, emitter ohmic contact 69, emitter-base mesa 70. Again the structure is then covered with a PECVD layer 37 of SiN as first level passivation for the III-V HBT 15', as shown in FIG. 3D. The collector, base, and emitter ohmic contacts can be formed through a thin layer of Pt/W.

Figure 3E:
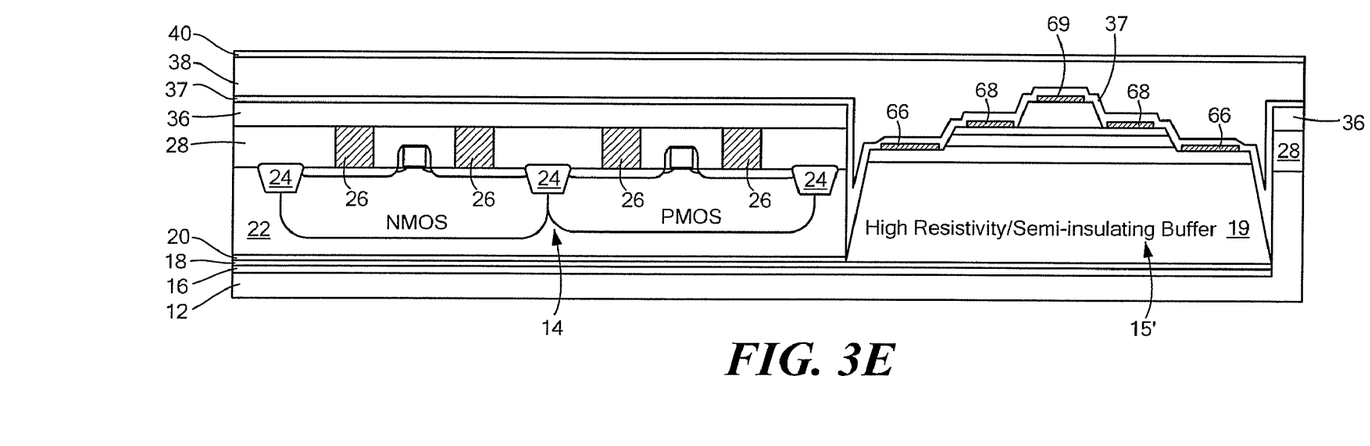
Figure 3F:
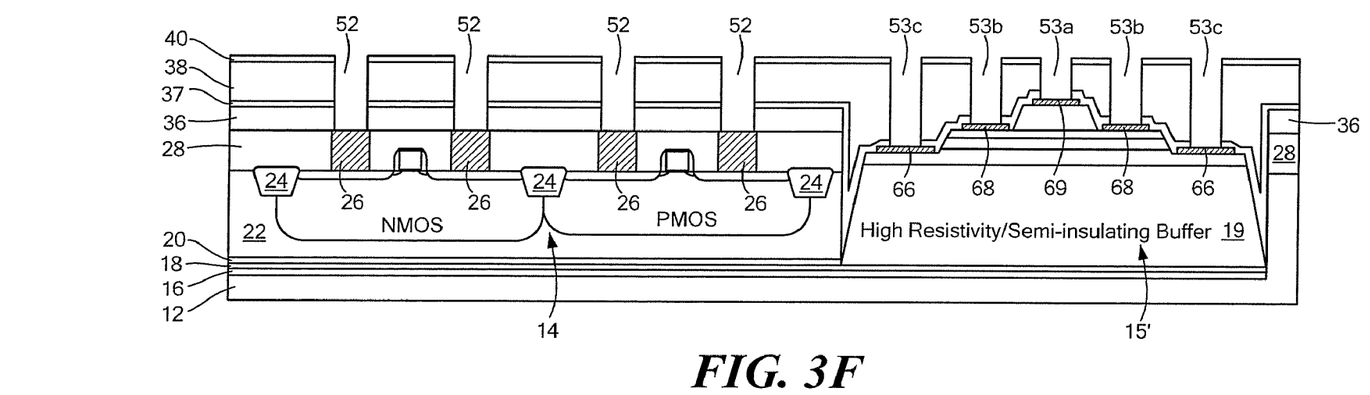
Figure 3G:
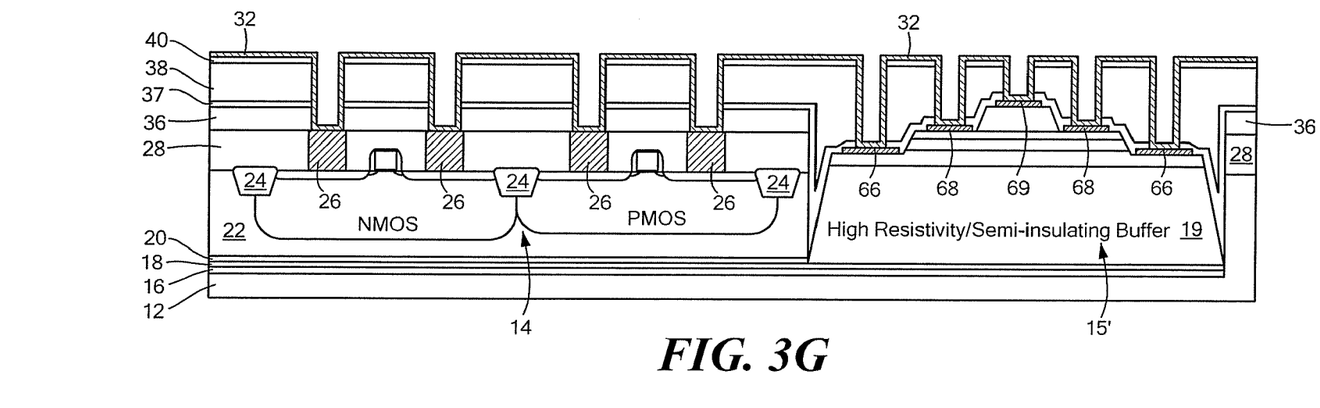
Figure 3H:
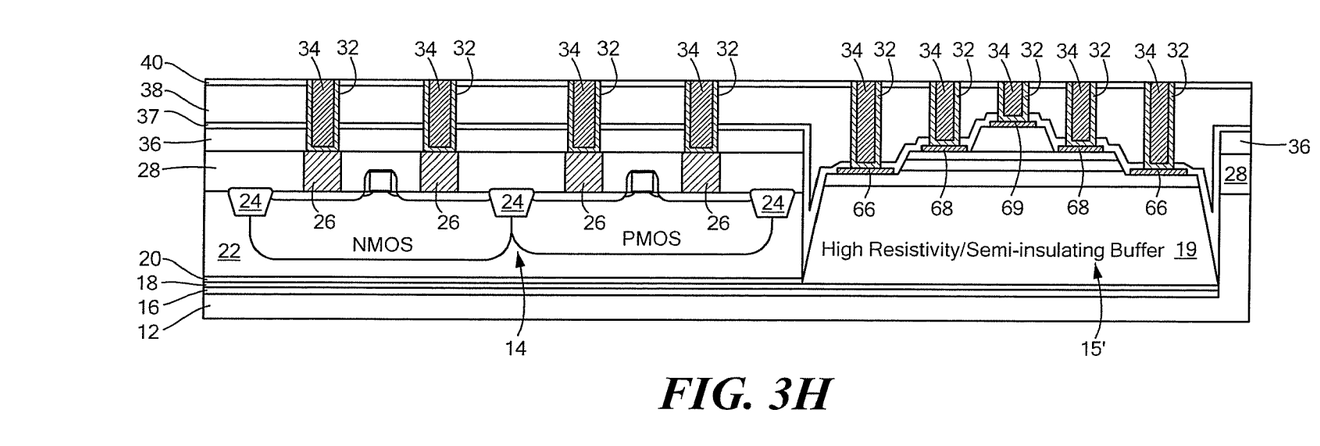

Referring to FIG. 3E, the structure is then processed as described above in connection with FIGS. 2E, 2F and 2G to produce the structures shown in FIGS. 3E, 3F and 3G respectively, to produce the structure shown in FIG. 3H. Thus, referring now to FIG. 3E, the low dielectric (low K) interlayer 38 is formed on the thin PECVD SiN layer 37 followed by deposition of the PECVD SiN hard mask layer 40 for copper CMP is formed on the low dielectric (low K) interlayer 38.

Referring now to FIG. 3F, contact holes 52 are formed through the dielectrics to reach the tungsten plugs 26 for the NMOS and PMOS FETs 14 and contact holes 53a, 53b and 53c are formed through the dielectrics to reach the collector, base and emitter contacts 66, 68 and 69 for the III-V HBT device 15'.

Referring now to FIG. 3G, the atomic deposited layer 32 Ni/TiN or Ni/TaN is deposited over the surface of the structure shown in FIG. 2F. The copper layer 34 is electroplated on the surface of layer 32 and then is chemically mechanically polished (CMP) resulting in the structure shown in FIG. 3H.

A number of embodiments of the invention have been described. Nevertheless, it will be understood that various modifications may be made without departing from the spirit and scope of the invention. For example, aluminum may be used for layer 34 instead of copper by sputtered deposition and subtractive patterning. Accordingly, other embodiments are within the scope of the following claims.

What is claimed is:

1. A semiconductor structure, comprising:
a substrate;
a seed layer over the substrate;
a silicon layer disposed on the seed layer;
a transistor device in the silicon layer;
a III-V layer disposed on the seed layer;
a III-V device disposed in the III-V layer;
a plurality of electrical contacts, each one of the electrical contacts having a layer of TiN or TaN and a layer of metal on the layer of TaN or TiN, one of the electrical contacts being electrically connected to the transistor device in the silicon layer and another one of the electrical contacts being electrically connected to the III-V device, said another one of the electrical contacts having a layer of Ge/W, Ni/Ge/W, Pd/Ge/Al or Pd/Ge/W in contact with the III-V layer and wherein the TaN or TiN layer is disposed on the layer of Ge/W, Ni/Ge/W, Pd/Ge/Al or Pd/Ge/W.

2. The structure recited in claim 1 where in the layer of metal is aluminum.

3. The structure recited in claim 1 wherein the layer of metal is copper.

4. The structure recited in claim 1 wherein the transistor device is a silicon field effect transistor.

5. The structure recited in claim 1 wherein the silicon layer has CMOS FETs therein.

6. The structure recited in claim 4 wherein the III-V device is an.

7. The structure recited in claim 5 wherein the III-V device is an FET.

8. The structure recited in claim 4 wherein the III-V device is a bipolar transistor.

9. The structure recited in claim 5 wherein the III-V device is a bipolar transistor.

10. A semiconductor structure, comprising:
a substrate;
a silicon layer disposed on the substrate;
a transistor device in the silicon layer;
a III-V device disposed on the substrate;
a plurality of electrical contacts, each one of the electrical contacts having a layer of TiN or TaN and a layer of metal on the layer of TaN or TiN, one of the electrical contacts being electrically connected to the transistor and another one of the electrical contacts being electrically connected to the III-V device, said another one of the electrical contacts having a layer of Ge/W, Ni/Ge/W, Pd/Ge/Al or Pd/Ge/W in contact with the III-V layer and wherein the TaN or TiN layer is disposed on the layer of Ge/W, Ni/Ge/W, Pd/Ge/Al or Pd/Ge/W.

11. The structure in claim 10 where the layer of metal is aluminum.

12. The structure in claim 10 where the layer of metal is copper.

13. A semiconductor structure, comprising:
a substrate;
a seed layer over the substrate;
a silicon layer disposed on the seed layer;
a transistor device in the silicon layer;
a III-V device disposed on the seed layer;
a plurality of electrical contacts, each one of the electrical contacts having a layer of TiN or TaN and a layer of copper or aluminum on the layer of TaN or TiN, one of the electrical contacts being electrically connected to the transistor and another one of the electrical contacts being electrically connected to the III-V device, said another one of the electrical contacts having a layer of Ge/W, Ni/Ge/W, Pd/Ge/Al or Pd/Ge/W in contact with the III-V layer and wherein the TaN or TiN layer is disposed on the layer of Ge/W, Ni/Ge/W, Pd/Ge/Al or Pd/Ge/W.

14. The structure recited in claim 12 wherein the transistor device is a silicon filed effect transistor.

15. The structure recited in claim 12 wherein the silicon layer has CMOS FETs therein.

16. The structure recited in claim 13 wherein the III-V device is an FET.

17. The structure recited in claim 14 wherein the III-V device is an FET.

18. The structure recited in claim 13 wherein the III-V device is a bipolar transistor.

19. The structure recited in claim 14 wherein the III-V device is a bipolar transistor.

20. A semiconductor structure, comprising:
a substrate;
a silicon layer disposed on the substrate;
a transistor device in the silicon layer;
a III-V layer disposed on the substrate;
a III-V field effect transistor device disposed in the III-V layer; and
a plurality of electrical contacts, each one of the electrical contacts having a layer of TiN or TaN, the layer of TiN or TaN being:
(A) electrically connected to the transistor device in the silicon layer;
(B) in Schottky contact with III-V material to provide a gate contact for the III-V field effect transistor device; and
(C) disposed on a layer of Ge/W, Ni/Ge/W, Pd/Ge/Al or Pd/Ge/W, such layer of Ge/W, Ni/Ge/W, Pd/Ge/Al or Pd/Ge/W being in contact with the source and drain regions of the III-V field effect transistor.

* * * * *